(12) United States Patent
Chen

(10) Patent No.: US 11,916,079 B2
(45) Date of Patent: Feb. 27, 2024

(54) SEMICONDUCTOR STRUCTURE

(71) Applicant: TAIWAN SEMICONDUCTOR MANUFACTURING COMPANY LTD., Hsinchu (TW)

(72) Inventor: Te-An Chen, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 143 days.

(21) Appl. No.: 17/356,257

(22) Filed: Jun. 23, 2021

(65) Prior Publication Data
US 2021/0320131 A1 Oct. 14, 2021

Related U.S. Application Data

(63) Continuation of application No. 16/258,566, filed on Jan. 26, 2019, now Pat. No. 11,081,500.

(51) Int. Cl.
*H01L 27/12* (2006.01)
*H01L 21/308* (2006.01)
*H01L 21/762* (2006.01)
*H01L 21/84* (2006.01)
*H01L 29/78* (2006.01)

(52) U.S. Cl.
CPC ........ *H01L 27/1211* (2013.01); *H01L 21/308* (2013.01); *H01L 21/76202* (2013.01); *H01L 21/845* (2013.01); *H01L 29/785* (2013.01)

(58) Field of Classification Search
CPC ............. H01L 21/76202; H01L 21/845; H01L 27/1211; H01L 29/785
See application file for complete search history.

(56) References Cited

U.S. PATENT DOCUMENTS

| | | | | |
|---|---|---|---|---|
| 2009/0072276 | A1* | 3/2009 | Inaba | H01L 29/7843 257/E21.409 |
| 2010/0163971 | A1* | 7/2010 | Hung | H01L 21/76202 257/327 |
| 2014/0015056 | A1* | 1/2014 | Fu | H01L 29/785 257/E21.409 |

* cited by examiner

*Primary Examiner* — Antonio B Crite
(74) *Attorney, Agent, or Firm* — WPAT LAW; Anthony King

(57) ABSTRACT

The present disclosure provides a semiconductor structure. The semiconductor structure includes a semiconductive substrate and an oxidation region formed on the semiconductive substrate. The oxidation region includes a stage with a first width along a horizontal direction. The semiconductor structure further includes a fin formed on a top surface of the stage. A method for forming the semiconductor structure is also provided.

20 Claims, 13 Drawing Sheets

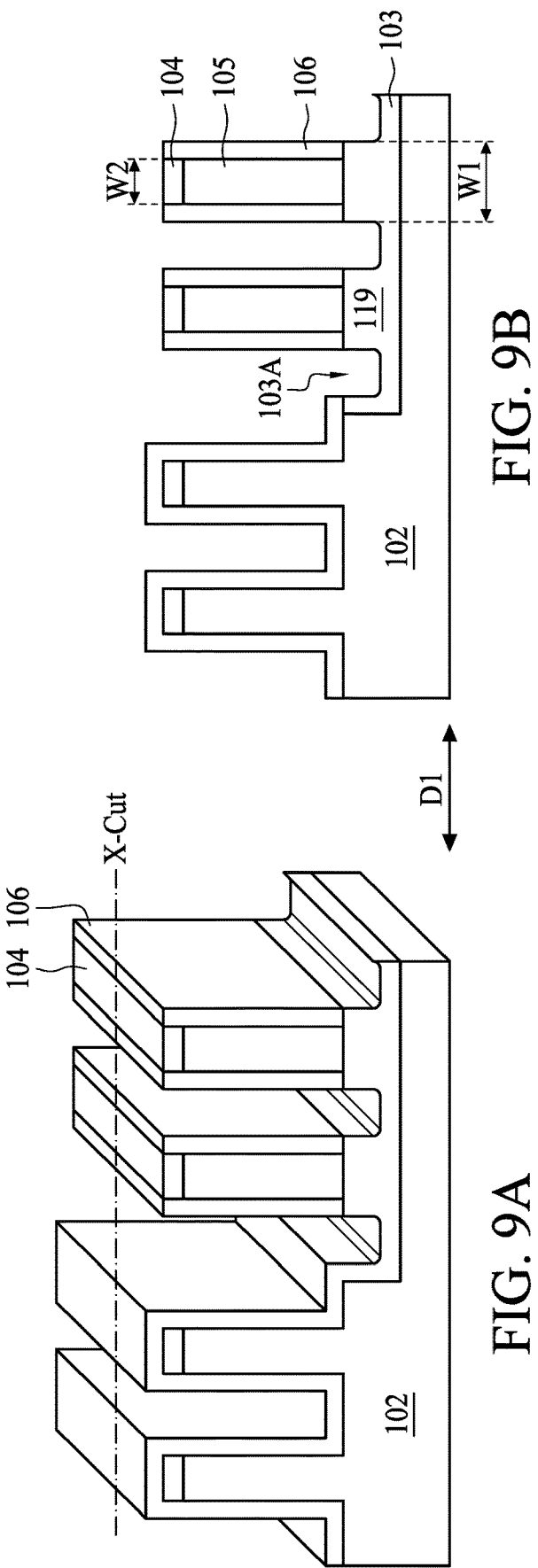

SEMICONDUCTOR STRUCTURE

CROSS-REFERENCE TO RELATED APPLICATIONS

This application is a continuation application of U.S. patent application Ser. No. 16/258,566 filed on Jan. 26, 2019, which is hereby incorporated by reference.

BACKGROUND

Current silicon-on-insulator (SOI FinFET structures are formed using an SOI substrate including a buried oxide (BOX) layer and an overlying silicon layer. The overlying silicon layer is patterned to form fins, on which the FinFET device is based. SOI FinFET devices provide excellent electrical performance. However, the manufacturing cost is high. Therefore, there is a need for an improved method of manufacturing an SOI FinFET structure.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 5 to 13 are cross-sectional views illustrating a method of forming a semiconductor structure, in accordance with some embodiments of the present disclosure.

DETAILED DESCRIPTION

Figure 1:
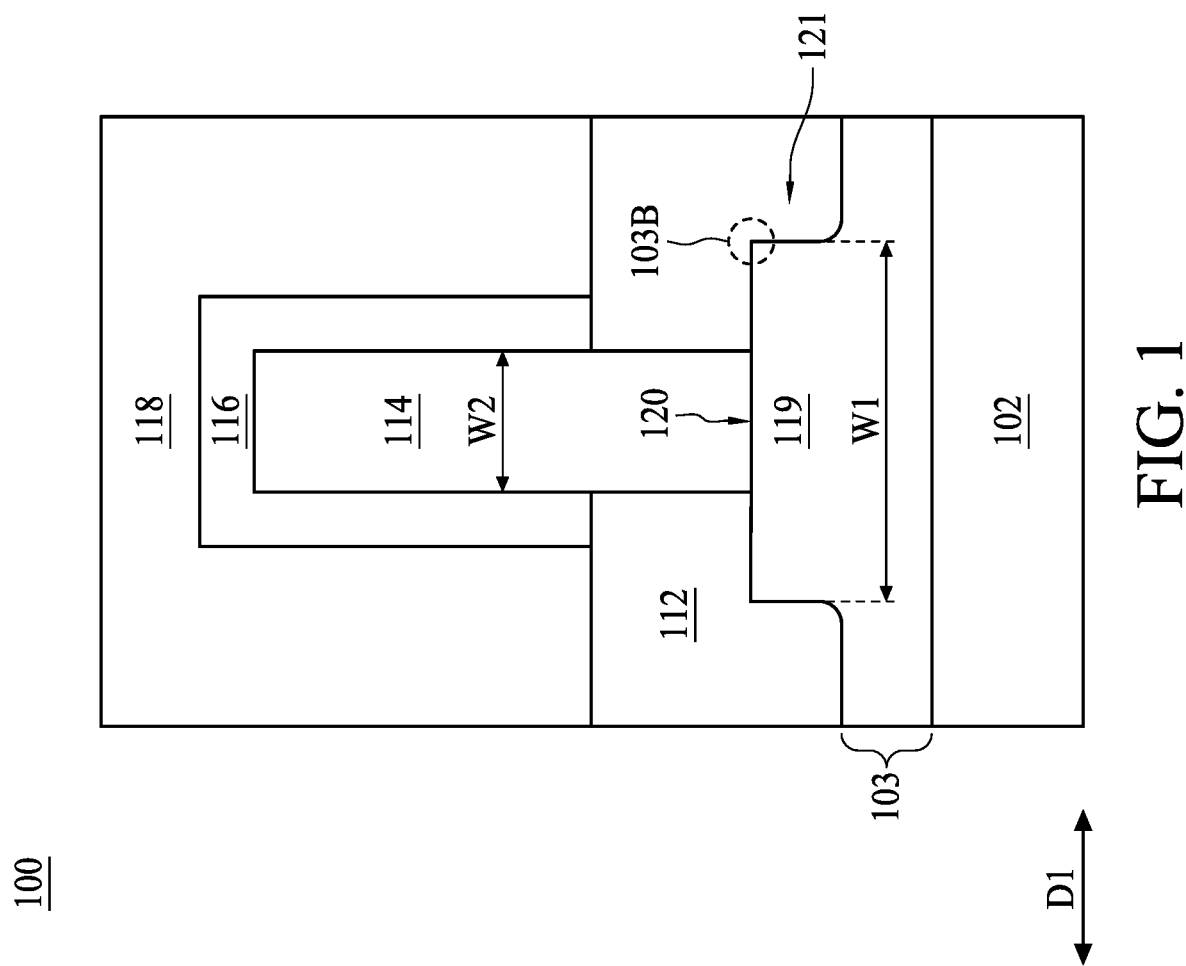
FIG. 1 is a cross-sectional view of a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art, Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

An SOI FinFET structure is formed using an SOI substrate including a buried oxide (BOX) layer and an overlying silicon layer. The overlying silicon layer is patterned to form fins, on which the FinFET device is based. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than those obtainable using a single, direct photolithography process. For example, in one embodiment, a sacrificial layer is formed over a substrate and patterned using a photolithography process. Spacers are formed along the patterned sacrificial layer using a self-aligned process. The sacrificial layer is then removed, and the remaining spacers may then be used to pattern the fins.

Due to the presence of the BOX layer, there is no extra leakage path in the SOI wafer, and parasitic capacitance is thereby reduced. The gate structure in the FinFET structure provides improved short channel effect and greater driver current due to larger effective width. Both FinFET and SOI structure have better gate control and lower leakage current. However, as the device designs progress into advanced technology nodes, the issue of leakage arises again. To obtain the maximum benefits from the FinFET and SOI devices, under existing methods, the FinFET structure is generally disposed on the SOI wafer so that the device can be provided a higher drive current from the FinFET structure and obtain lower capacitance and leakage from the SOI wafer. However, such approach incurs increased cost because of the expensive SOI wafer. To address such issue, the present disclosure provides a method to construct an SOI FinFET structure without using an SOI wafer, and the SOI FinFET structure formed from the method. Other features and processes may also be included.

Referring to FIG. 1, FIG. 1 is a cross-sectional view of a semiconductor structure 100, in accordance with some embodiments of the present disclosure. In some embodiments, the semiconductor structure 100 includes a semiconductive substrate 102 with a fin 114 formed thereon.

The semiconductor structure 100 further includes an oxidation region 103 between the semiconductive substrate 102 and the fin 114. In some embodiments, the oxidation region 103 is over the semiconductive substrate 102. In some embodiments, the oxidation region 103 is under the fin 114.

In some embodiments, the oxidation region 103 includes a stage 119 with a first width W1 along a horizontal direction D1. In some embodiments, a top surface 120 of the stage 119 is flat, and the horizontal direction D1 is perpendicular to a normal vector of the top surface 120. The first width W1 is measured as the distance between the sidewalls 121 of the stage as seen in a cross-sectional view.

The fin 114 is formed on the top surface 120 of the stage. In some embodiments, the top surface 120 of the stage is in contact with the fin 114. In some embodiments, the fin has a second width W2 along the horizontal direction, wherein the second width W2 is less than the first width W1 of the stage. In some embodiments, the mid-point of the second width W2 is aligned with the mid-point of the first width W1.

In some embodiments, the semiconductor structure 100 further includes an insulator 112 covering a portion of the top surface 120, and the portion is free from the fin 114. In some embodiments, the top surface 120 of the stage 119 is covered by the insulator 112 and the fin 114. In some embodiments, the top surface 120 of the stage 119 is in contact with the insulator 112 and the fin 114.

In some embodiments, a corner 103B of the stage 119 is in contact with the insulator 112. In some embodiments, the corner 103B is the meeting point of the top surface 120 and the sidewalls 121 of the stage. In some embodiments, although the sidewalk 121 are perpendicular to the horizontal direction D1, and the corner 103B is a right angle as seen from a cross-sectional view, the present disclosure is not limited thereto. In some embodiments, the corner 103B is a round-corner. In some embodiments, the corner 103B is an obtuse angle. In some embodiments, the stage has two steps as seen from a cross-sectional view. In some embodiments, the two steps are covered by the insulator 112.

In some embodiments, the fin 114 is partially surrounded by the insulator 112. In some embodiments, the semiconductor structure 100 further includes a gate dielectric 116 on the top surface and sidewalls of the fin 114. In some embodiments, the gate dielectric 116 partially surrounds the fin 114. In some embodiments, a lower portion of the fin 114 is surrounded by the insulator 112 and an upper portion of the fin 114 is surrounded by the gate dielectric 116.

In some embodiments, the gate dielectric 116 is conformably deposited on the fin 114. In some embodiments, a combined width of the fin 114 and the gate dielectric 116 deposited thereon is greater than the second width W2, and less than the first width W1 along the horizontal direction D1. In some embodiments, the semiconductor structure 100 further includes a gate electrode 118 on the insulator 112 and the gate dielectric 116.

Figure 2:
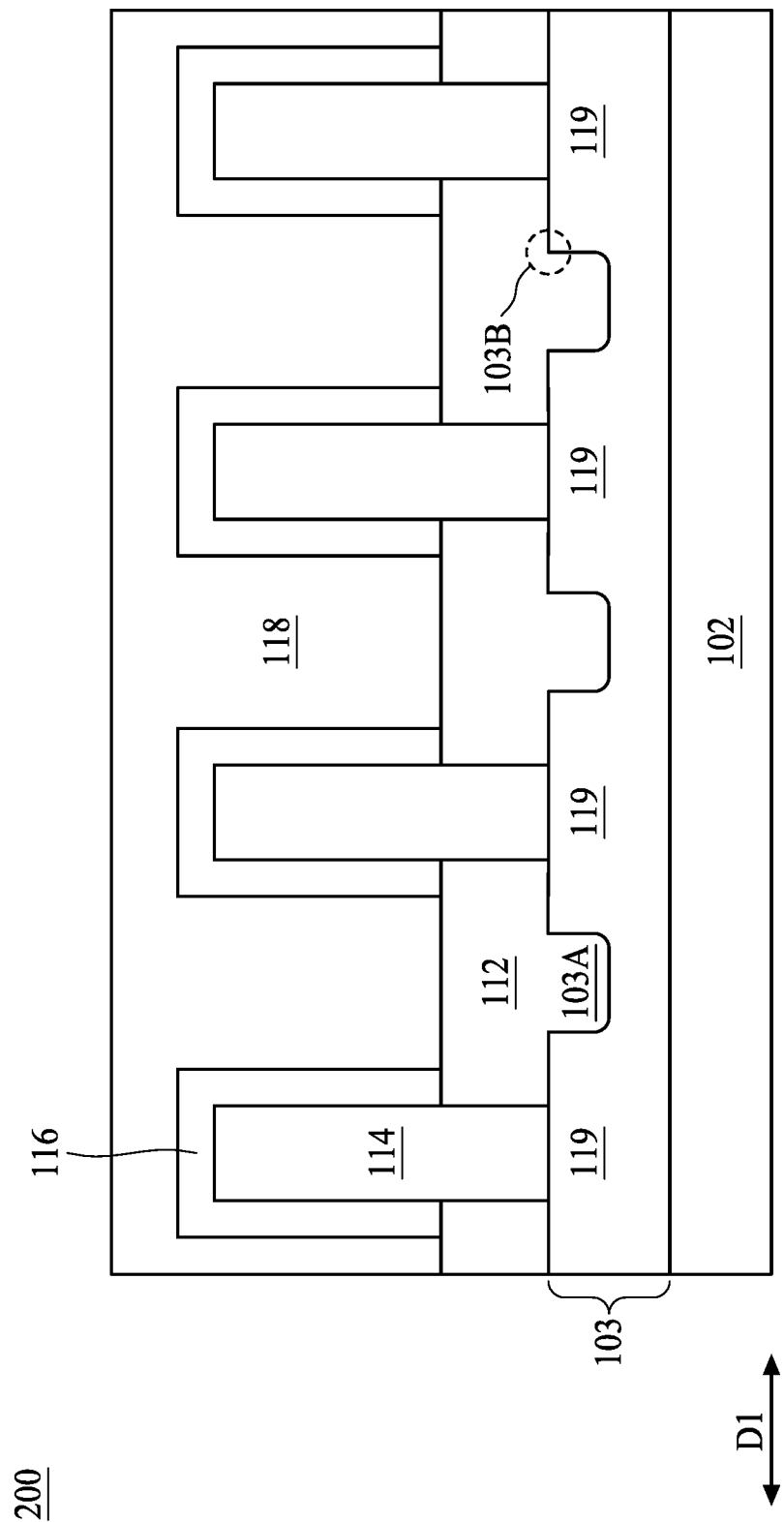
FIG. 2 is a cross-sectional view of a semiconductor structure, in accordance with some embodiments of the present disclosure.

Referring to FIG. 2, FIG. 2 is a cross-sectional view of a semiconductor structure 200, in accordance with some embodiments of the present disclosure. Because the semiconductor structure 200 in FIG. 2 is similar to the semiconductor structure 100 described above in relation to FIG. 1, identical numbers represent similar components for simplicity of explanation. In addition, descriptions of such similar components are omitted in the interest of brevity, and only the differences are provided.

In some embodiments, the semiconductor structure 200 includes several fins 114 formed on the semiconductive substrate 102. The numbers and arrangements of the fins are illustrated merely as examples for explanation, and the present disclosure is not limited thereto.

The oxidation region 103 is disposed between the semiconductive substrate 102 and the fins 114. In some embodiments, the oxidation region 103 includes a trench 103A between two of the fins 114. In some embodiments, a trench 103A is between two of the stages 119 of the oxidation region 103. In some embodiments, the sidewalk of the stages 119 mentioned above are also the sidewalls of the trench 103A. In some embodiments, the corners 103B of the stages 119 mentioned above are also the corners close to the openings of the trench 103A. In some embodiments, the trenchs 103A and the stages 119 are staggered mutually. In some embodiments, a surface of the oxidation region 103 that contacts the semiconductive substrate 102 is continuous. In some embodiments, the stages 119 are formed on the continuous surface.

In some embodiments, the fins 114 are separated from each other by the insulators 112. In some embodiments, the fins 114 are separated from each other by the trenches 103A. In some embodiments, the corners 103B of the stages 119 are in contact with the insulators 112. In some embodiments, the insulators 112 are filled into the trenches 103A. In some embodiments, each of the insulators 112 between two fins 114 fills into the trenches 103A.

Figure 3:
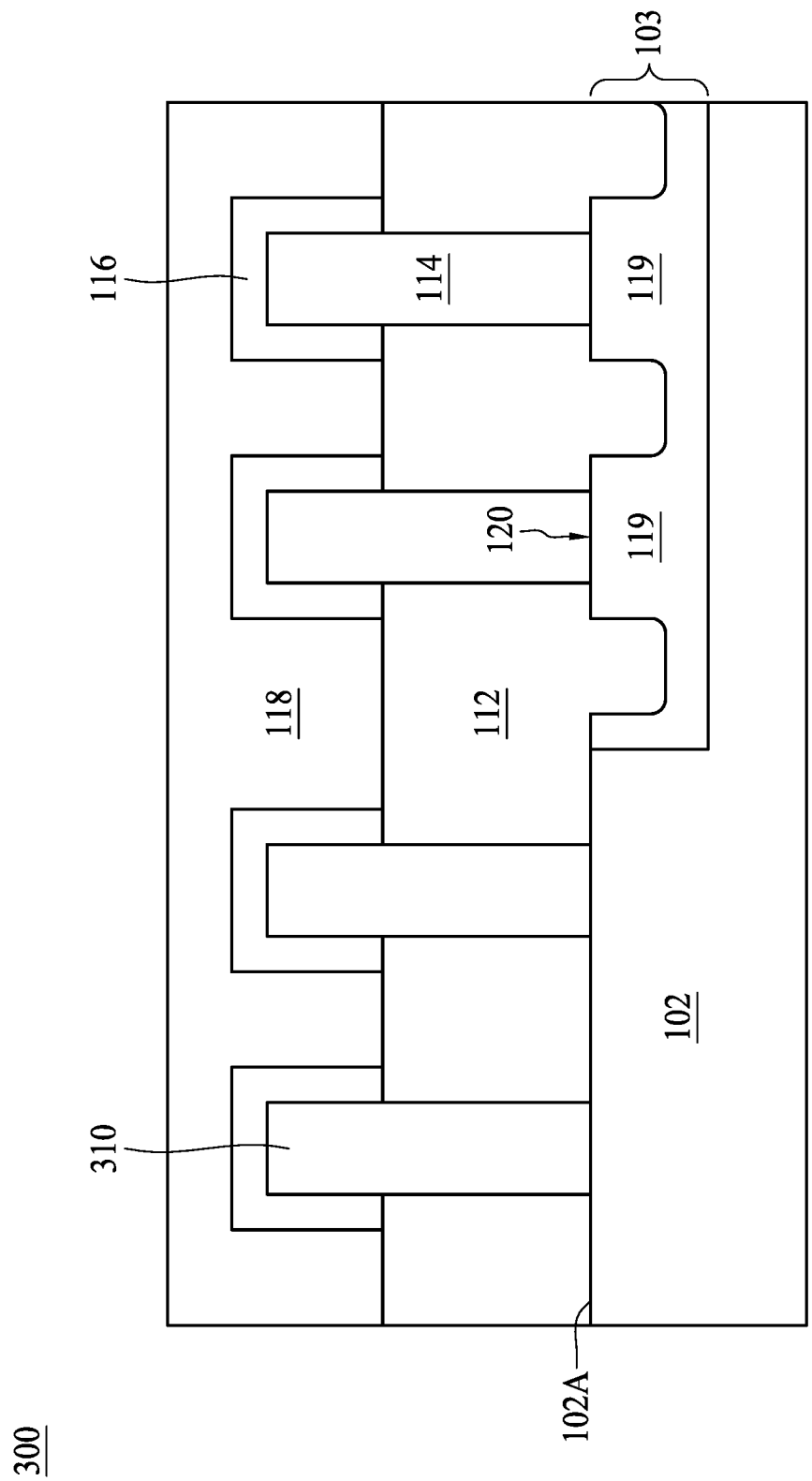
FIG. 3 is a cross-sectional view of a semiconductor structure, in accordance with some embodiments of the present disclosure.

Referring to FIG. 3, FIG. 3 is a cross-sectional view of a semiconductor structure 300, in accordance with some embodiments of the present disclosure. Because the semiconductor structure 300 in FIG. 3 is similar to the semiconductor structure 200 described above in relation to FIG. 2, identical numbers represent similar components for simplicity of explanation. In addition, descriptions of such similar components are omitted in the interest of brevity, and only the differences are provided.

In some embodiments, the semiconductor structure 300 includes several fins 114 separated from the semiconductive substrate 102 by the oxidation region 103. In some embodiments, the semiconductor structure 300 also includes several fins 310 formed on and in contact with the semiconductive substrate 102. Instead of being separated from the semiconductive substrate 102 by the oxidation region 103, the fins 310 directly contact a top surface 102A of the semiconductive substrate 102.

In some embodiments, the top surface 120 of the oxidation region 103 is coplanar with the top surface 102A of the semiconductive substrate 102. In some embodiments, the oxidation region 103 is formed from a part of the semiconductive substrate 102. In some embodiments, the oxidation region 103 is formed in the semiconductive substrate 102.

The numbers and arrangements of the two kinds of fins 310 and 114 are illustrated merely as examples for explanation, and the present disclosure is not limited thereto.

In some embodiments, each of the fins 310 and 114 is separated from other fins 310 and 314 by the insulator 112. In some embodiments, the oxidation region 103 is enclosed within the semiconductive substrate 102 and the insulator 112. In some embodiments, the gate electrode 118 is formed over each of the fins 310 and 114.

Figure 4:
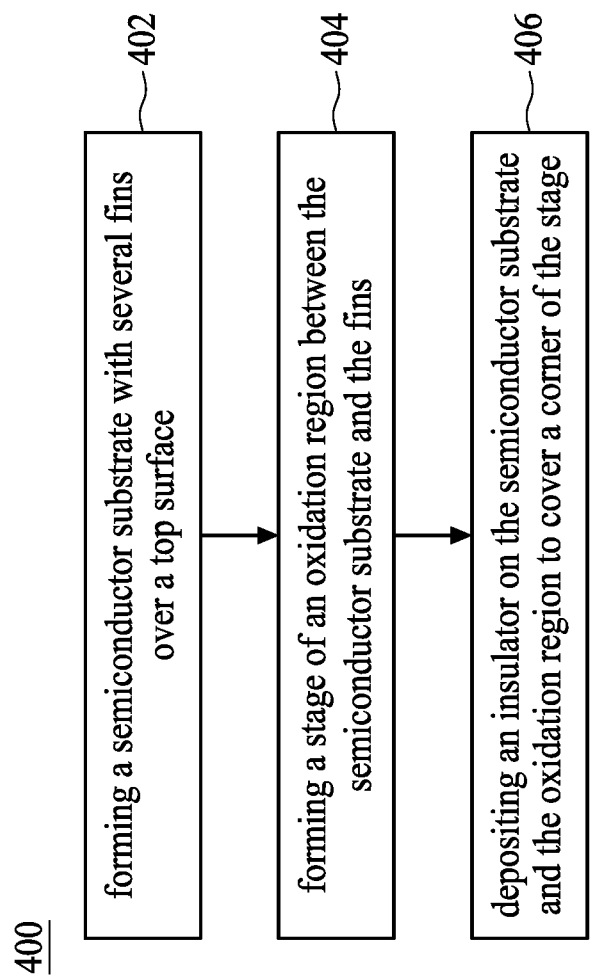
FIG. 4 is a block diagram illustrating a method for manufacturing a semiconductor structure, in accordance with some embodiments of the present disclosure.

Referring to FIG. 4, FIG. 4 is a block diagram illustrating a method 400 for manufacturing a semiconductor structure, in accordance with some embodiments of the present disclosure. The method 400 is described herein with reference to FIGS. 5 to 13, and identical numbers represent similar components for simplicity of explanation.

The method 400 includes operation 402, forming a semiconductive substrate with several fins over a top surface, which will be described with reference to FIG. 5. The method 400 further includes operation 404, forming a stage of an oxidation region between the semiconductive substrate and the fins, which will be described with reference to FIGS. 6 to 9B. The method 400 further includes operation 406, depositing an insulator on the semiconductive substrate and the oxidation region to cover a corner of the stage, which will be described with reference to FIGS. 10A to 11B.

Figure 5:
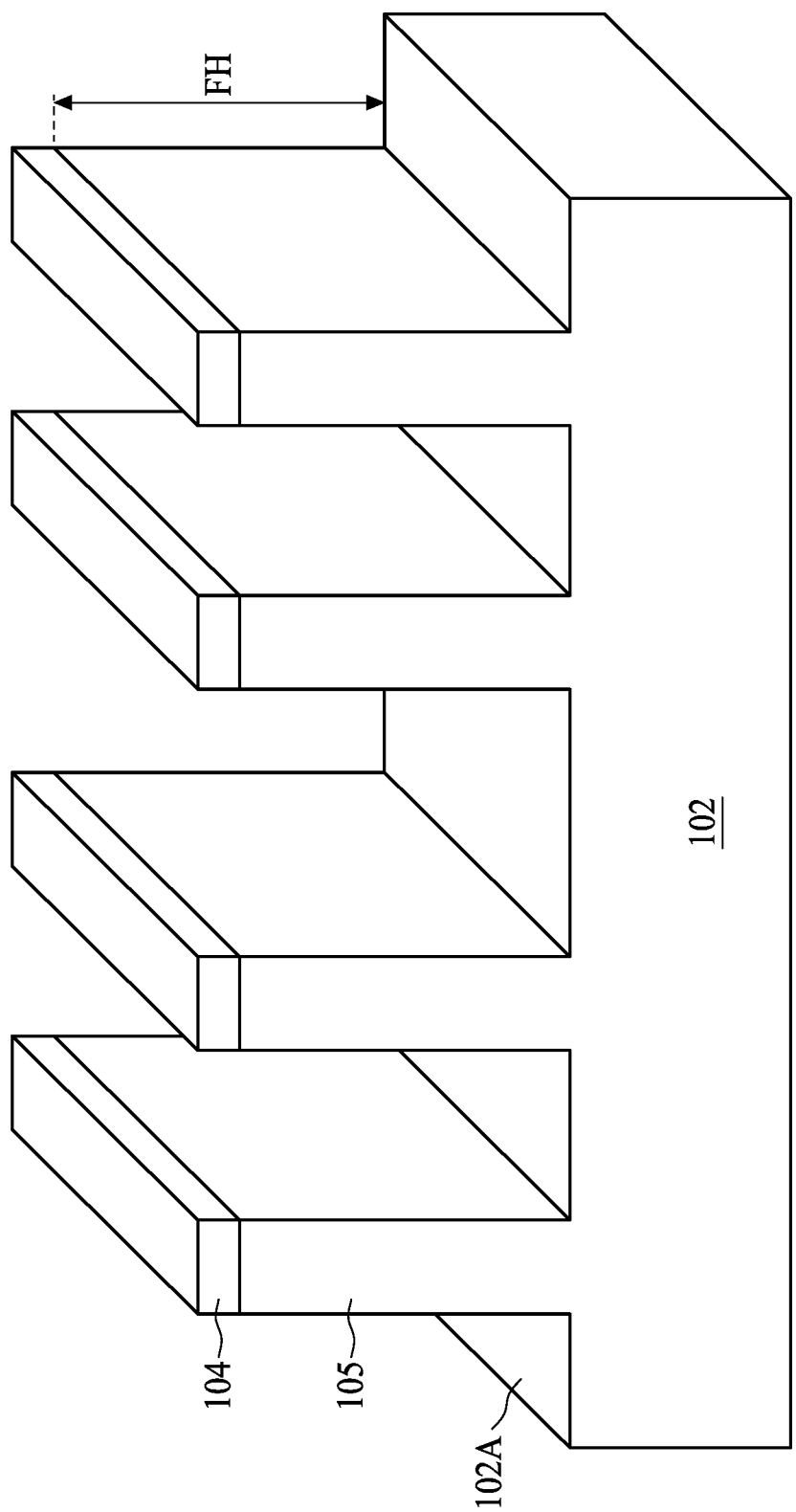

Referring to FIG. 5, the method 400 begins at operation 402, forming a semiconductive substrate 102 with several fins 105 over a top surface 102A. The semiconductive substrate 102 may include a silicon substrate, a silicon germanium substrate, or a substrate formed of other semiconductor materials. In some embodiments, the semiconductive substrate 102 may be doped with a p-type or an n-type impurity.

In some embodiments, a hard mask 104 is provided on the semiconductive substrate 102. The hard mask 104 and the semiconductive substrate 102 are etched through a photolithographic operation to form the fins 105 with fin-heights FH between about 80 nm and about 320 nm. In an exemplary embodiment, the aspect ratio (the ratio of the height to the width) of the fins 105 may be greater than about 1, or greater than about 5.

In some embodiments, the hard mask 104 may be formed by thermal nitridation of silicon, plasma-enhanced chemical vapor deposition (PECVD), low-pressure chemical vapor deposition (LPCVD), or plasma anodic nitridation using nitrogen-hydrogen. In some embodiments, the hard mask 104 is formed of silicon nitride using LPCVD. In some embodiments, the hard mask 104 may have a thickness of about 60 nm to about 120 nm.

In some embodiments, a pad layer is formed between the hard mask 104 and the semiconductive substrate 102. In some embodiments, the pad layer is a thin film formed through a thermal process, wherein the thin film includes silicon oxide. In some embodiments, the pad layer is used to buffer the hard mask 104 and the semiconductive substrate 102 so that less stress is generated. In some embodiments, the pad layer may also act as an etch stop layer for etching the subsequently formed hard mask 104.

In a photolithographic operation for etching the hard mask 104 and the semiconductive substrate 102, a photoresist is formed on the hard mask 104, and the photoresist is then patterned by forming openings in the photoresist. In some embodiments, the hard mask 104 and the semiconductive substrate 102 may be etched through two steps. For example, the hard mask 104 is etched through the openings of the photoresist, exposing the underlying semiconductive substrate 102. Next, the semiconductive substrate 102 is etched, so that the openings extend into the semiconductive substrate 102. The fins 105 are thereby formed on the semiconductive substrate 102, and the top surface 102A is exposed through the fins 105. In some embodiments, the fins 105 are formed as vertical fins extending above the semiconductive substrate 102. In some embodiments, the hard mask 104 and the semiconductive substrate 102 together may be etched in one step. In some embodiments, the fins 105 are used to form source and drain regions and channel regions therebetween (not shown).

Figure 6:
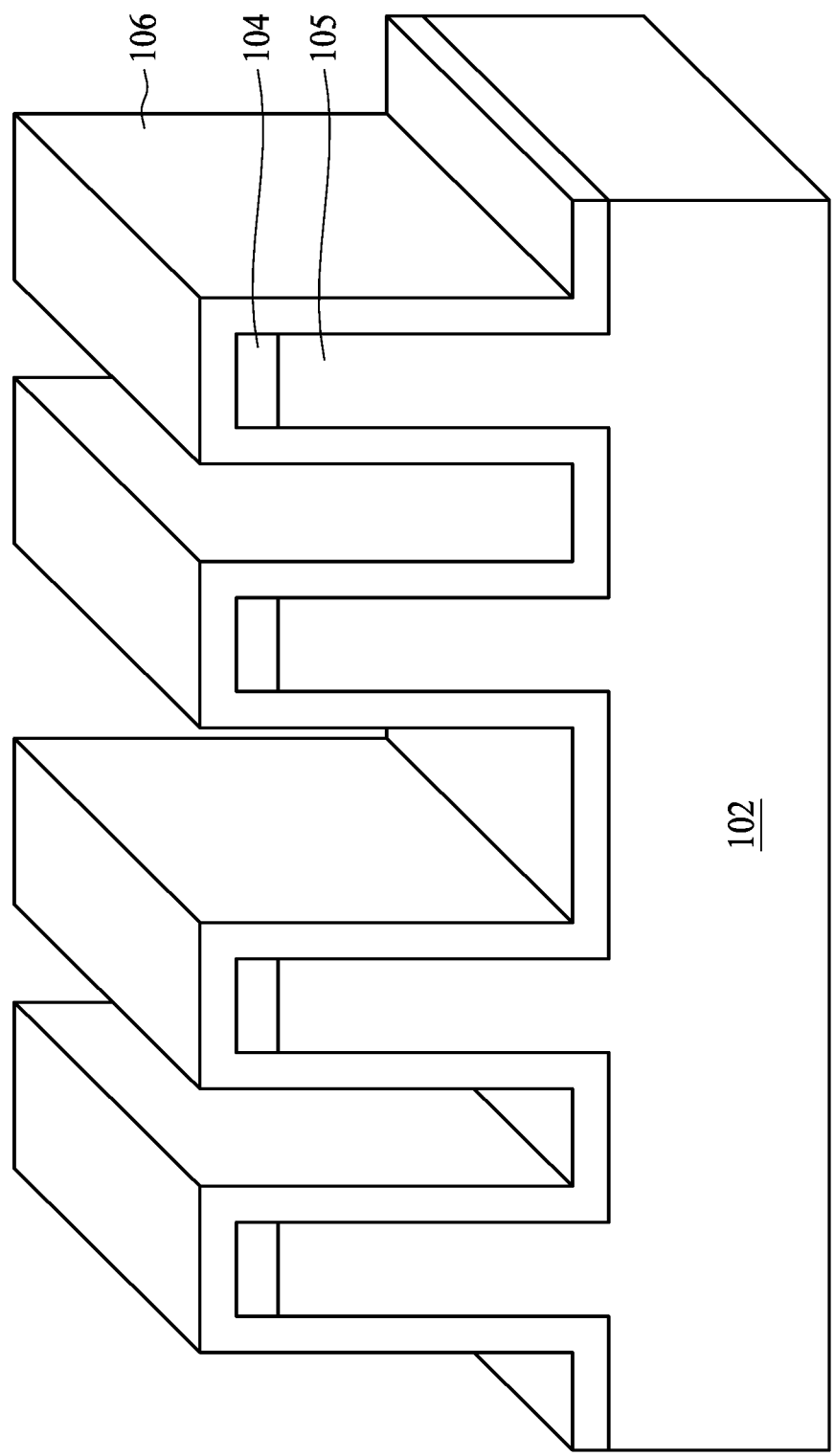

Referring to FIGS. 6 to 9B, the method 400 proceeds to operation 404, forming a stage 119 of an oxidation region 103 between the semiconductive substrate 102 and the fins 105. In FIG. 6, a dielectric film 106 is deposited to cover the top surface 102A and the fins 105. In some embodiments, the dielectric film 106 is deposited evenly over the surface topography of the top surface 102A and the fins 105. The dielectric film 106 covers the top surface of the hard mask 104 and the sidewalls of the fins 105, and further extends into the openings between the fins 105 to cover the top surface 102A of the semiconductive substrate 102.

In some embodiments, the dielectric film 106 may include porous materials, such as porous oxides, porous nitrides, porogens, or combinations thereof. In some embodiments, the dielectric film 106 may include organo silicate glass (OSG), borophosphosilicate glass (BPSG), borosilicate glass (BSG), phosphosilicate glass (PSG), fluorinated silicate glass (FSG), or combinations thereof. In some embodiments, the dielectric film 106 may also include extreme low-k (ELK) dielectrics, which typically have a dielectric constant less than about 2. Suitable ELK dielectric materials may include spin-on-glass (SOG), plasma enhanced tetraethoxysilane (PETEOS), or halogenated SiO. In some embodiments, the dielectric film 106 may be formed by various deposition techniques such as Atomic Layer Deposition (ALD), Chemical Vapor Deposition (CVD), Physical Vapor Deposition (PVD), sputtering, plating, or coating.

Figure 7:
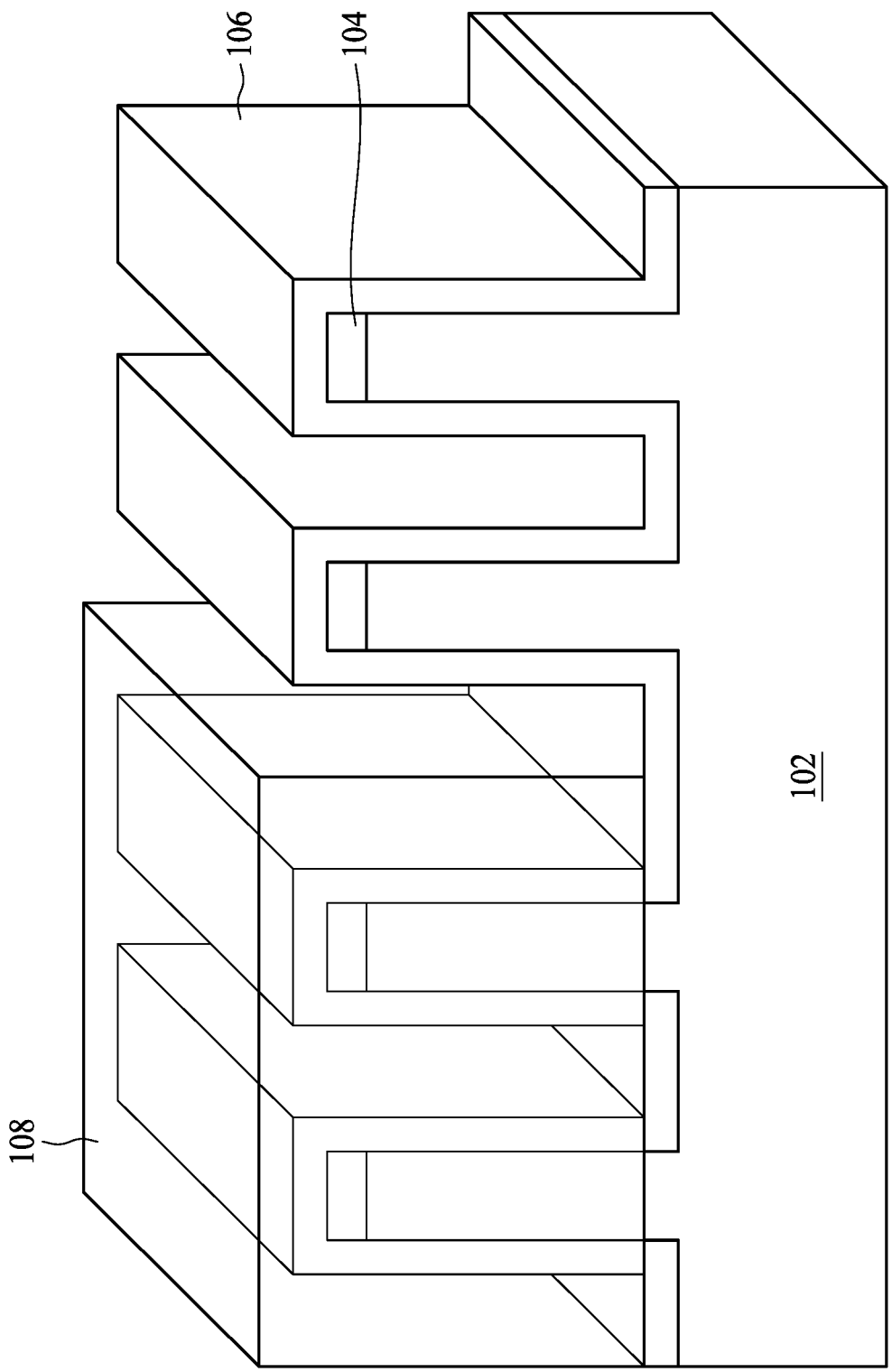

In FIG. 7, a photoresist 108 is deposited to cover a part of the dielectric film 106. The part of the dielectric film 106 that is covered by the photoresist 108 is selected to include the fins that contact the semiconductive substrate 102, such as the fins 310 described above with reference to FIG. 3. The part of the dielectric film 106 that is not covered by the photoresist 108 is selected to include the fins that are separated from the semiconductive substrate 102 by the oxidation region 103, such as the fins 114 described above with reference to FIG. 3.

Figure 8B:
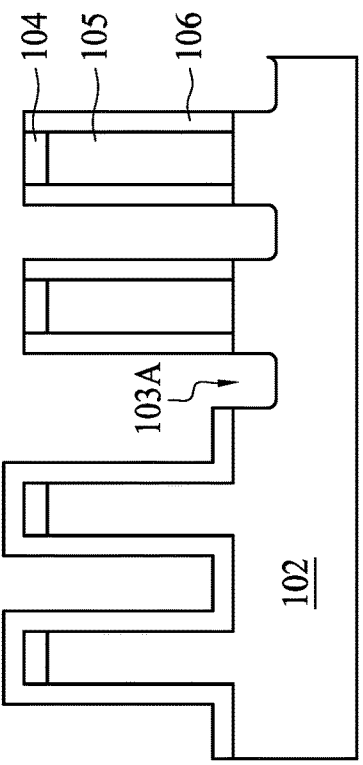
Figure 8A:
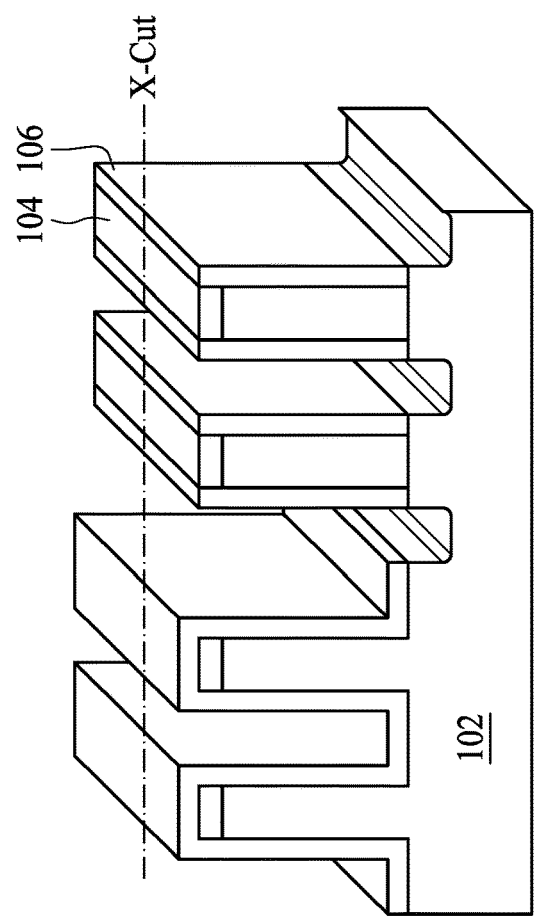

In FIGS. 8A and 8B, a first etching operation is performed to remove a part of the dielectric film 106 that is not covered by the photoresist 108. In some embodiments, the first etching operation is an isotropic etching operation. The part of the dielectric film 106 that is covered by the photoresist 108 remains unetched. The first etching direction is perpendicular to the top surface 102A. In the part of the dielectric film 106 that is not covered by the photoresist 108, the dielectric film 106 on the sidewalk of the fins 105 remains unetched, while the dielectric film 106 on the top surface of the fins 105 is etched away. The dielectric film 106 on the top surface 102A of the semiconductive substrate 102 is also etched away. A portion of the top surface 102A is exposed through the dielectric film 106 in the first etching operation.

After the first etching operation to remove a part of the dielectric film 106, a second etching operation is performed with a predetermined etchant. Trenches 103A are formed in the semiconductive substrate 102 through the second etching operation. The exposed top surface 102A is etched away by the predetermined etchant. The trenches 103A are deepened below the top surface 102A into the semiconductive substrate 102.

In some embodiments, the second etching operation is an isotropic etching operation. In the second etching operation, the dielectric film 106, when etched with the predetermined etchant, has an etch rate lower than that of the semiconductive substrate 102. The dielectric film 106 remains substantially unetched. Therefore, the sidewalls of the trenches 103A are substantially coplanar with a surface of the dielectric film 106 on the sidewalk of the fins 105.

In some embodiments, stages 119 of the oxidation region 103 are formed between the semiconductive substrate 102 and the fins 105 after the second etching operation. The stages 119 have the first width W1 along the horizontal direction D1. The fins have the second width W2 that is less than the first width W1.

In some embodiments, the photoresist 108 is removed after the first etching operation. In some embodiments, the photoresist 108 is removed after the second etching operation. In some embodiments, the removal of the photoresist 108 is followed by an annealing operation performed in a hydrogen environment. In some embodiments, the hydrogen annealing is performed at a temperature between about 850° C. and about 1050° C. The hydrogen annealing causes the migration of the silicon atoms, and the exposed sidewalk of the trenches 103A are thereby smoothened.

In FIGS. 9A and 9B, a portion of the semiconductive substrate 102 is oxidized to form the oxidation region 103. The oxidation region 103 is also referred to as punch-through stoppers due to their function of stopping punch-through currents. In some embodiments, the semiconductive substrate 102 is formed of silicon, and the oxidation region 103 is formed of silicon oxide. It should be noted that although the width of the oxidized region depends on the amount of oxygen and the process conditions of the oxidation operation, the width W1 of the stage 119 is fixed, resulting in a more stable performance of the SOI FinFET structure. In some embodiments, the entire stages 119 are oxidized.

In some embodiments, the trenches 103A and the adjacent portions that contact the dielectric film 106 are oxidized. In some embodiments, the oxidation region 103 is formed such that the fins 105 are isolated from the semiconductive substrate 102. In some embodiments, the oxidation region 103 is formed such that the trenches 103A are in the oxidation region 103. In some embodiments, the sidewalk of the trenches 103A are substantially coplanar with a surface of the dielectric film 106 on the sidewalk of the fins 105.

In some embodiments, the bottom portion of the semiconductive substrate 102 is under the oxidation region 103 and is not oxidized. In some embodiments, the boundary of the oxidation region 103 and the semiconductive substrate 102 depends on the amount of oxygen and the process conditions of the oxidation operation, and can be adjusted in order to form the punch-through stoppers.

Referring to FIGS. 10A to 11B, the method 400 proceeds to operation 406, depositing an insulator 112 on the semiconductive substrate 102 and the oxidation region 103 to cover a corner 103B of the stages 119.

Figure 10B:
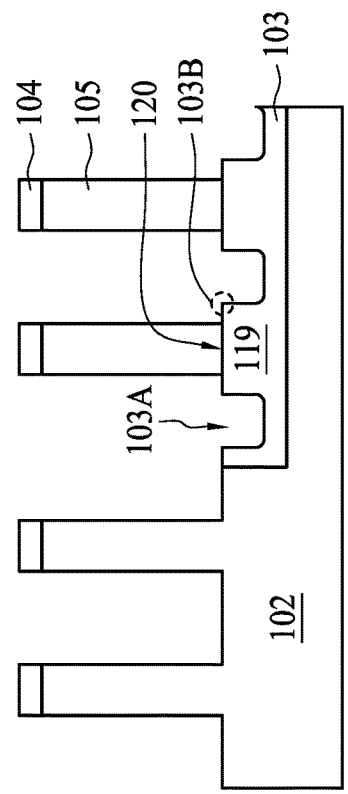
Figure 10A:
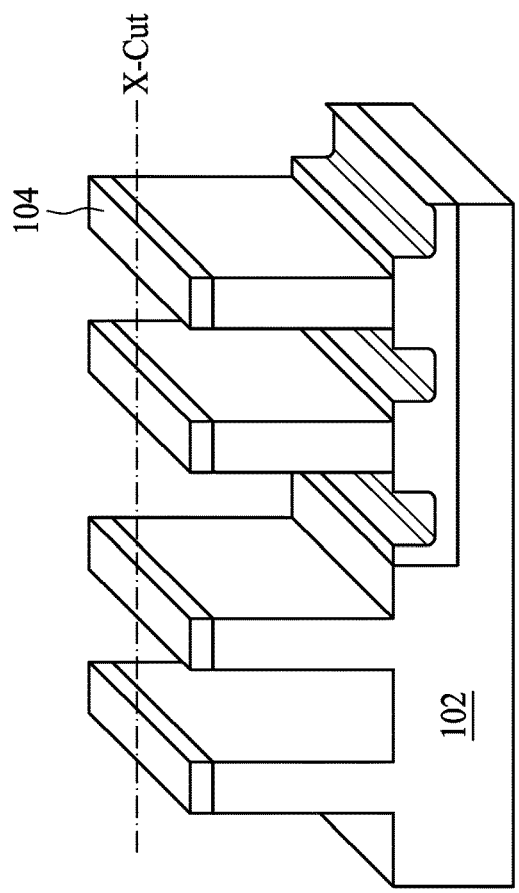

In FIGS. 10A and 10B, the dielectric film 106 is removed to expose a portion of the top surface 120 of the oxidation region 103 and the fins 105. In some embodiments, the corners 103B of the stages 119 are exposed.

Figure 11B:
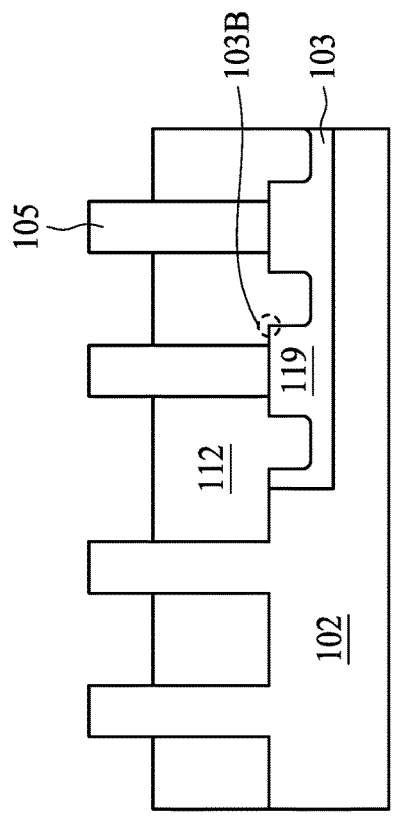
Figure 11A:
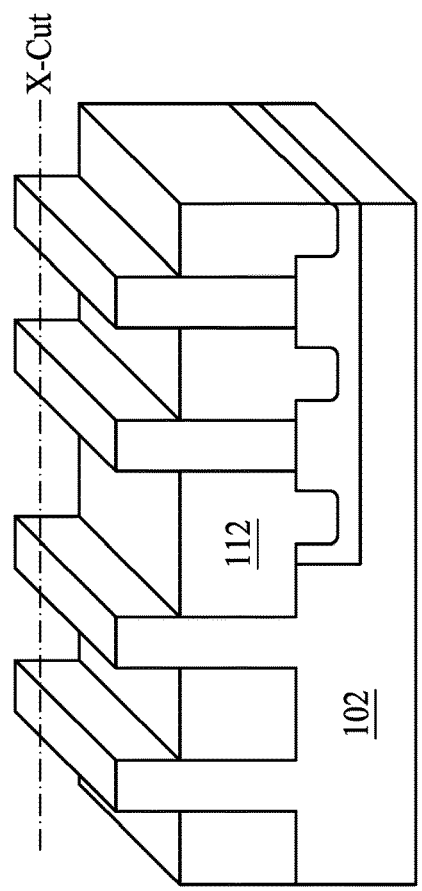

In FIGS. 11A and 11B, the insulator 112 is deposited on the semiconductive substrate 102 and the oxidation region 103. In some embodiments, the insulator 112 covers the corners 103B of the stages 119. In some embodiments, the insulator 112 isolates each of the fins 105. In some embodiments, the insulator 112 is filled into the trenches 103A. In some embodiments, the insulator 112 between the fins 105 forms isolation regions. The isolation regions may also be referred to as shallow trench isolation (STI) regions. The isolation regions are formed to extend downward from a top surface 102A of the semiconductive substrate 102. The isolation regions may include two neighboring isolation regions having their sidewalls facing each other, with one fin 105 between, and adjoining, the two neighboring isolation regions.

In some embodiments, the insulator 112 is deposited so that the fins 105 are embedded in the insulator 112. In some embodiments, the excess insulator 112 may be removed by an etch back process, a dry etch, a wet etch, or other suitable process. In some embodiments, the hard mask 104 may be removed.

Figure 12A:
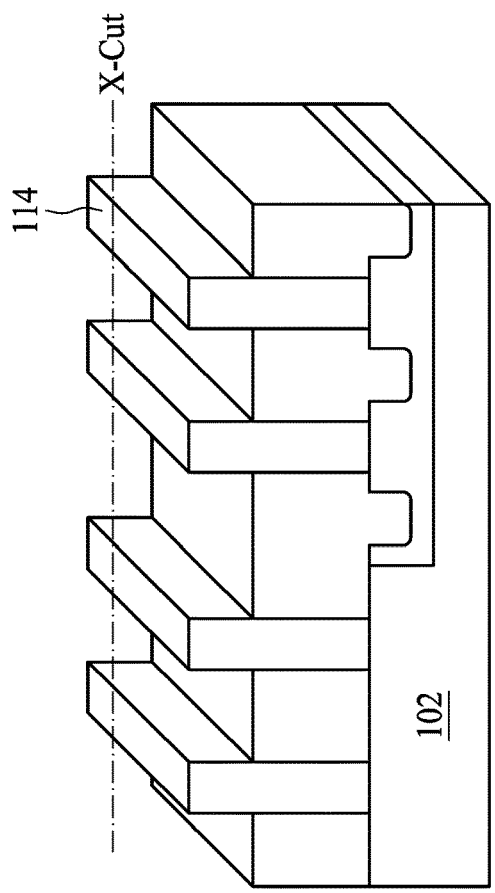
Figure 12B:
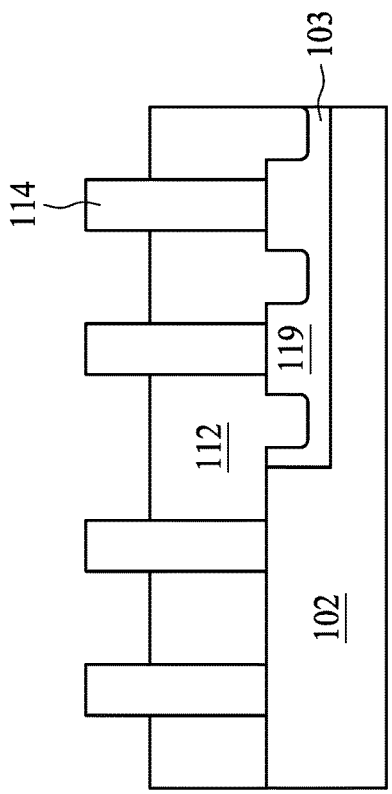

In FIGS. 12A and 12B, the fins 105 are replaced with fins of other semiconductor materials. In some embodiments, the semiconductor materials of the fins 114 may be formed by selective epitaxial growth (SEG). In some embodiments, the semiconductor materials of the fins 114 may include a compound semiconductor, such as, but not limited to, GaAs, InP, GaN, InGaAs, InAlAs, GaSb, AlSb, AlAs, AlP, GaP, combinations thereof or multi-layers thereof.

Figure 13:
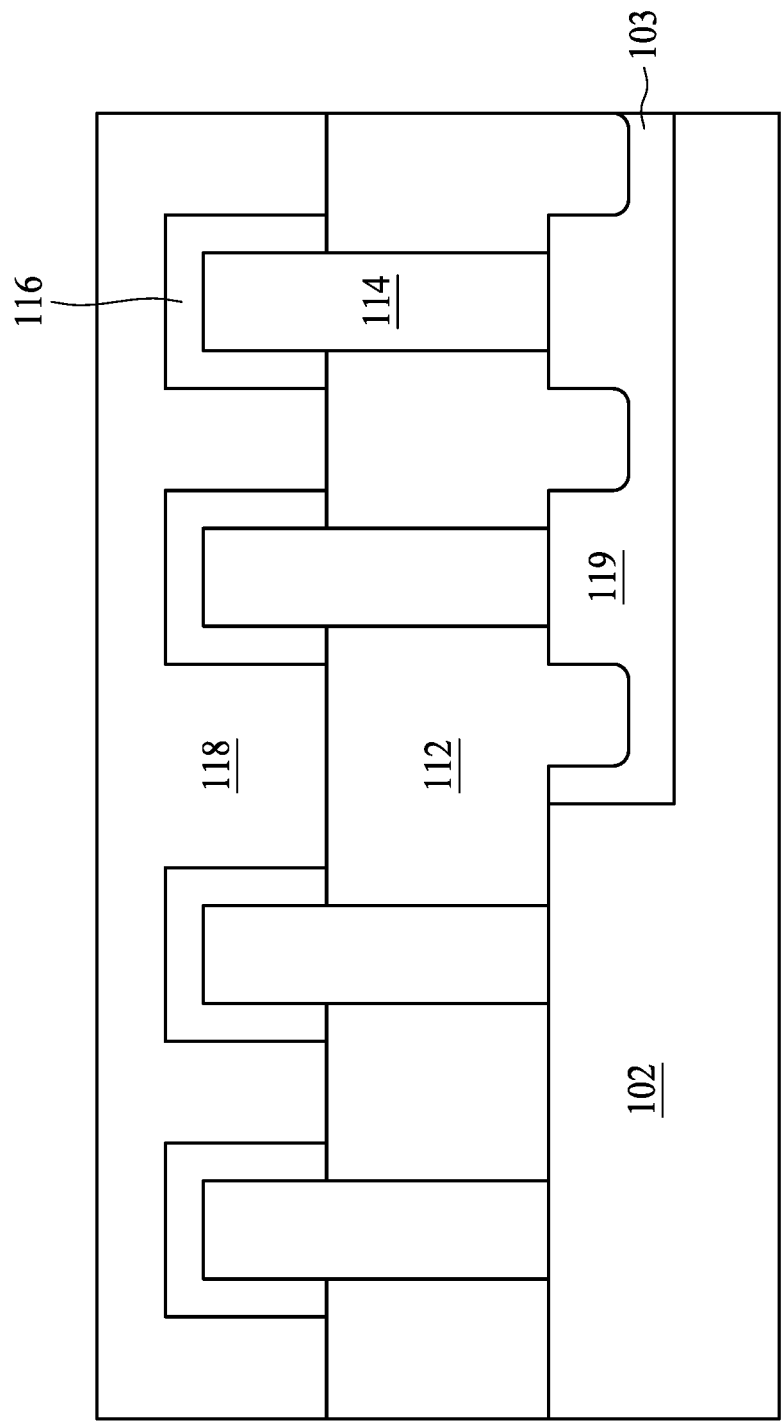

In FIG. 13, the gate dielectrics 116 and the gate electrode 118 are formed on the top surface and side walls of the fin 114. In some embodiments, dummy gate dielectrics and dummy gate electrodes (also called a dummy gate stack, not shown) may be formed first, and will be replaced by the gate dielectrics 116 and the gate electrode 118 in a subsequent operation. The dummy gate stack may be formed using gate-first approaches or gate-last approaches. The dummy gate stack may be removed by etch back process, dry etch, wet etch, or other suitable process.

The gate electrode 118 may extend over a single fin 114 or a plurality of fins 114 and/or the isolation regions 112. The gate electrode 118 may have a lengthwise direction substantially perpendicular to the lengthwise direction of the fin 114.

In some embodiments, the gate dielectric 116 may include silicon dioxide. The gate dielectric 116 may further include high-k dielectrics such as $HfO_2$, $TiO_2$, $HfZrO$, $Ta_2O_3$, $HfSiO_4$, $ZrO_2$, $ZrSiO_2$, combinations thereof, or other suitable material. In some embodiments, the gate electrode 118 may include a plurality of layers, such as interfacial layers, gate dielectric layers, work function layers, capping layers, and/or other suitable layers. For example, a high-k film may line the internal sidewalls of gate spacers (not shown) and the gate dielectric 116.

In some embodiments, the gate electrode 118 may include work function layers, such as a p-type work function layer and an n-type work function layer. Exemplary p-type work function metals that may be included in the gate electrode 118 include TiN, TaN, Ru, Mo, Al, WN, $ZrSi_2$, $MoSi_2$, $TaSi_2$, $NiSi_2$, WN, other suitable materials, or combinations thereof. Exemplary n-type work function metals that may be included in the gate electrode 118 include Ti, Ag, TaAl, TaAlC, TiAlN, TaC, TaCN, TaSiN, Mn, Zr, other suitable materials, or combinations thereof. The work function layer may include a plurality of layers. The work function layer(s) may be deposited by CVD, PVD, and/or other suitable process.

In some embodiments, the gate electrode 118 may include an interfacial layer. The interfacial layer may include a dielectric material such as silicon oxide ($SiO_2$) or silicon oxynitride (SiON). The interfacial dielectric layer may be formed by chemical oxidation, thermal oxidation, ALD, or CVD.

In some embodiments, the gate electrode 118 may include a fill metal layer. The fill metal layer may include Al, W, or Cu, other suitable materials, or combinations thereof. The fill metal layer may be formed by CVD, PVD, plating, and/or other suitable processes. The fill metal layer may be deposited over the work function metal layer(s), thereby filling in the remaining portion of the trenches or openings formed by the removal of the dummy gate stacks. In some embodiments, a silicide layer may interpose the work function layer and the fill metal layer.

In some embodiments, subsequent processing may further include forming various contacts/vias/lines and multilayer interconnect features (e.g., metal layers and interlayer dielectrics) over the substrate, configured to connect the various features or structures of the semiconductor structure. The additional features may provide electrical interconnection to the semiconductor structure including the formed metal gate structures. For example, a multilayer interconnection includes vertical interconnects, such as conventional vias or contacts, and horizontal interconnects, such as metal lines. The various interconnection features may implement various conductive materials including copper, tungsten, and/or silicide. In one example a damascene and/or dual damascene process is used to form a copper related multi layer interconnection structure.

Some embodiments of the present disclosure provide a semiconductor structure. The semiconductor structure includes a semiconductive substrate and an oxidation region formed on the semiconductive substrate. The oxidation region includes a stage with a first width along a horizontal direction. The semiconductor structure further includes a fin formed on a top surface of the stage.

Some embodiments of the present disclosure provide a semiconductor structure. The semiconductor structure includes a semiconductive substrate and several fins formed on the semiconductive substrate. The semiconductor structure further includes an oxidation region between the semiconductive substrate and the fins. The oxidation region includes a trench between two of the fins.

Some embodiments of the present disclosure provide a method for forming a semiconductor structure. The method includes forming a semiconductive substrate with several fins over a top surface. The method further includes forming a stage of an oxidation region between the semiconductive substrate and the fins. The method further includes depositing an insulator on the semiconductive substrate and the oxidation region to cover a corner of the stage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure, comprising:
a semiconductive substrate;
an oxidation region formed on the semiconductive substrate, wherein the oxidation region includes a stage;
a fin formed on a top surface of the stage;
an insulator covering a portion of the top surface of the stage, and the fin is partially surrounded by the insulator; and
a gate dielectric formed on the insulator and partially surrounding the fin,
wherein a corner of the stage is in contact with the insulator.

2. The semiconductor structure of claim 1, wherein the top surface of the stage of the oxidation region is substantially coplanar with a top surface of the semiconductive substrate.

3. The semiconductor structure of claim 1, wherein the stage has a first width along a horizontal direction, the fin has a second width along the horizontal direction, and the second width is less than the first width.

4. The semiconductor structure of claim 1, further comprising a gate electrode disposed on the insulator and the gate dielectric, and transversing the fin.

5. The semiconductor structure of claim 1, wherein the oxidation region further includes a trench adjacent to the stage, and a bottom of the trench is lower than the top surface of the stage.

6. The semiconductor structure of claim 1, wherein the top surface of the stage is in contact with a lower surface of the fin.

7. The semiconductor structure of claim 1, wherein a combined width of the fin and the gate dielectric is less than a width of the stage.

8. A semiconductor structure, comprising:
a semiconductive substrate;
a plurality of fins formed on the semiconductive substrate; and
an oxidation region between the semiconductive substrate and the fins, wherein the oxidation region includes a trench between two of the fins,
wherein the oxidation region forms a stage, the stage has a first width along a horizontal direction, each of the fins has a second width along the horizontal direction, and the second width is less than the first width.

9. The semiconductor structure of claim 8, wherein the stage is disposed between each of the fins and the semiconductive substrate.

10. The semiconductor structure of claim 8, further comprising a gate dielectric partially surrounding the fins, and a combined width of the gate dielectric and one of fins is less than a width of the stage.

11. The semiconductor structure of claim 8, wherein the fins are separated from each other by an insulator, and wherein a corner of the oxidation region is in contact with the insulator.

12. The semiconductor structure of claim 11, wherein the insulator is filled into the trench.

13. The semiconductor structure of claim 11, wherein the oxidation region is enclosed between the semiconductive substrate and the insulator.

14. A semiconductor structure, comprising:
a semiconductive substrate;
a first fin formed on the semiconductive substrate;
a second fin formed on the semiconductive substrate;

an insulator separating the first fin from the second fin; and an oxidation region on the semiconductive substrate, wherein the first fin is separated from the semiconductor substrate by the oxidation region, and the second fin is in contact with the semiconductive substrate, wherein the oxidation region includes a stage under the first fin, and a top surface of the stage is in contact with a lower surface of the first fin, and wherein the oxidation region includes a recessed region adjacent to the stage, and a bottom of the recessed region is lower than the top surface of the stage.

15. The semiconductor structure of claim 14, wherein the insulator is filled into the recessed region.

16. The semiconductor structure of claim 14, wherein a top surface of the oxidation region is coplanar with a top surface of the semiconductive substrate.

17. The semiconductor structure of claim 14, wherein the stage has a first width along a horizontal direction, each of the first fins has a second width along the horizontal direction, and the second width is less than the first width.

18. The semiconductor structure of claim 14, wherein a lower portion of the first fin and a lower portion of the second fin are surrounded by the insulator.

19. The semiconductor structure of claim 18, further comprising:

a gate dielectric formed on the insulator and surrounding a top portion of the first fin and a top portion of the second fin; and a gate electrode disposed on the insulator and the gate dielectric, and transversing the first fin and the second fin.

20. The semiconductor structure of claim 19, wherein a combined width of the first fin and the gate dielectric is less than a width of the stage.

* * * * *